(12) United States Patent
Klotzbuecher et al.

(10) Patent No.: US 9,465,087 B2
(45) Date of Patent: Oct. 11, 2016

(54) HALL EFFECT SENSOR

(71) Applicant: Robert Bosch GmbH, Stuttgart (DE)

(72) Inventors: Thomas Klotzbuecher, Rudersberg (DE); Harald Kazmierczak, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 11 days.

(21) Appl. No.: 14/414,477

(22) PCT Filed: May 15, 2013

(86) PCT No.: PCT/EP2013/060056
§ 371 (c)(1),
(2) Date: Jan. 13, 2015

(87) PCT Pub. No.: WO2014/009043
PCT Pub. Date: Jan. 16, 2014

(65) Prior Publication Data
US 2015/0168506 A1 Jun. 18, 2015

(30) Foreign Application Priority Data
Jul. 13, 2012 (DE) .................. 10 2012 212 272

(51) Int. Cl.
*G01R 33/07* (2006.01)
*G01R 33/00* (2006.01)
*G01R 1/30* (2006.01)
*G01R 35/00* (2006.01)

(52) U.S. Cl.
CPC ............ *G01R 33/07* (2013.01); *G01R 1/30* (2013.01); *G01R 33/0035* (2013.01); *G01R 33/0094* (2013.01); *G01R 33/072* (2013.01); *G01R 35/00* (2013.01)

(58) Field of Classification Search
None
See application file for complete search history.

(56) References Cited

U.S. PATENT DOCUMENTS

| 4,518,918 | A | 5/1985 | Avery |
| 5,218,298 | A | 6/1993 | Vig |
| 5,594,335 | A | 1/1997 | Melbert |
| 5,883,567 | A | 3/1999 | Mullins |
| 6,335,598 | B1 | 1/2002 | Lin et al. |
| 2002/0021124 | A1 | 2/2002 | Schott et al. |
| 2006/0113989 | A1 | 6/2006 | Nicolosi |
| 2007/0029999 | A1 | 2/2007 | Middelhoek et al. |

(Continued)

FOREIGN PATENT DOCUMENTS

| DE | 19753778 | 6/1999 |
| DE | 10320057 | 12/2004 |

(Continued)

OTHER PUBLICATIONS

International Search Report for Application No. PCT/EP2013/060056 dated Jul. 26, 2013 (English Translation, 2 pages).

*Primary Examiner* — Jermele M Hollington
(74) *Attorney, Agent, or Firm* — Michael Best & Friedrich LLP

(57) ABSTRACT

The invention relates to a Hall effect sensor for recording the direction of a magnetic field, comprising a plurality of Hall effect sensor elements (10a, 10b) arranged in pairs, wherein each pair comprises a first Hall effect sensor element (10a) and a second Hall effect sensor element (10b) which are arranged parallel to one another. The Hall effect sensor has a first switch (34) for disconnecting the first Hall effect sensor element (10a) from a power supply (24).

18 Claims, 2 Drawing Sheets

(56) References Cited

U.S. PATENT DOCUMENTS

| | | | | |
|---|---|---|---|---|
| 2011/0018534 A1* | 1/2011 | Peukert | ............... | G01R 33/07 324/251 |
| 2013/0253864 A1* | 9/2013 | Fujita | ............... | G01R 33/0005 702/65 |
| 2015/0115937 A1* | 4/2015 | Fujita | ............... | G01R 33/07 324/207.12 |
| 2015/0354985 A1* | 12/2015 | Judkins, III | ............... | G01D 5/142 324/207.14 |

FOREIGN PATENT DOCUMENTS

| | | |
|---|---|---|
| DE | 102004047784 | 4/2006 |
| DE | 102008000943 | 10/2009 |
| EP | 0115391 | 8/1984 |
| EP | 2355052 | 8/2011 |

* cited by examiner

HALL EFFECT SENSOR

BACKGROUND OF THE INVENTION

The invention relates to a Hall effect sensor.

Hall effect sensors can be designed in such a way that said sensors can either record the magnetic field strength or the direction of the magnetic field.

In the case of Hall effect sensors which are designed to record the direction of the magnetic field, four pairs of Hall effect sensor elements can be arranged on a radius at an angle of 90° to one another. The Hall effect sensors are arranged in pairs in order to improve the signal-to-noise ratio and to be able to better evaluate the resulting Hall voltage which is generally extremely low.

Each pair of Hall effect sensor elements comprises two Hall effect sensor elements which are arranged parallel to one another and are connected in parallel to one another and which correspond to the Hall effect sensor elements of the oppositely disposed pair. Each pair delivers a Hall voltage as a function of the current flowing through the elements of the pair and the direction (or strength) of the prevailing magnetic field. The direction of the magnetic field can be determined from the Hall voltages of the Hall effect sensor elements.

If one of the Hall effect sensor elements is defective, the Hall effect sensor no longer operates reliably. The service life of the Hall effect sensor described above is therefore determined by the shortest service life of one of the Hall effect sensor elements. For that reason, two redundant Hall effect sensors are frequently used.

SUMMARY OF THE INVENTION

The aim of the invention is to provide a Hall effect sensor which has a longer service life.

An aspect of the invention relates to a Hall effect sensor for recording the direction of a magnetic field.

According to one embodiment of the invention, the Hall effect sensor comprises a plurality of Hall effect sensor elements arranged in pairs, wherein each pair comprises a first Hall effect sensor element and a second Hall effect sensor element which are arranged parallel to one another. The Hall effect sensor has a first switch for disconnecting the first Hall effect sensor element from a power supply. It is also possible for the switch to be designed to connect the first Hall effect sensor element to the power supply. The switch can be disposed in a supply line from the power supply to the Hall effect sensor element.

During a normal operation of the Hall effect sensor (i.e. if a defect has not occurred or has not been ascertained), all switches are normally closed. If a defect occurs in the first Hall effect sensor element, said sensor element can be disconnected from the power supply. If the first Hall effect sensor element has been disconnected from the power supply, said sensor element no longer delivers a Hall voltage even if a prevailing magnetic field is present, said Hall voltage possibly being changed by the defect such that it suggests a different magnetic field. This could lead to a faulty output of the Hall effect sensor.

In this way, a redundancy can be implemented by one individual Hall effect sensor, which is only possible with two Hall effect sensors in the case of the Hall effect sensors mentioned at the beginning of the application. A redundant Hall effect sensor can be constructed without having to introduce additional Hall effect sensor elements and further develop the Hall effect sensor.

According to one embodiment of the invention, the Hall effect sensor has a second switch for disconnecting the second Hall effect sensor element from the power supply. In particular, all of the Hall effect sensor elements can be disconnected from or, respectively, connected to the power supply separately from one another.

According to one embodiment of the invention, the first switch and/or the second switch comprise(s) in each case two semiconductor switching elements, e.g. transistors, which are connected upstream and downstream of the associated first Hall effect sensor element and/or the second Hall effect sensor element. The two semiconductor switching elements can be disposed upstream and downstream of the semiconductor switching element in a supply line to the power supply. If both semiconductor switching elements are opened, parasitic capacitances are then also decoupled from the corresponding supply line.

The switches can comprise MOSFETs. The aforementioned semiconductor switches are, for instance, MOSFETs. The MOSFETs can be individually switched by a controller of the Hall effect sensor.

According to one embodiment of the invention, each pair of Hall effect sensor elements comprises a first switch for a first Hall effect sensor element and a second switch for a second Hall effect sensor element. In other words, all of the Hall effect sensor elements can be connected and/or disconnected independently of one another or, respectively, individually to/from the power supply.

According to one embodiment of the invention, the pairs of Hall sensor elements are disposed at the same distance from a central point. Each pair can be oriented towards the central point. In this way, a component of the magnetic field can be recorded by two opposing pairs.

According to one embodiment of the invention, the Hall effect sensor comprises a controller for determining the direction of the magnetic field from an output voltage of the Hall effect sensor elements. This electronic controller can be disposed on the same chip as the Hall effect sensor elements and the switches thereof. The electronic controller is also designed to actuate the first switch, the second switch and/or further switches which are designed to disconnect an associated Hall effect sensor element from the power supply. The controller can, for example, open and/or close said switches.

According to one embodiment of the invention, the controller is designed to determine whether the first Hall effect sensor element and/or the second Hall effect sensor element is defective. In this case, i.e. when a defect has been detected, the controller can disconnect the first Hall effect sensor element or, respectively, the defective Hall effect sensor element from the power supply or, respectively, open the associated switch.

According to one embodiment of the invention, the controller is designed to emit an external signal if a defect has been detected. For example, a voltage signal can be applied to an output of the chip if the defect was detected. In this way, the Hall effect sensor can indicate that it is still in a position to work but should be replaced. This message can be outputted at a corresponding pin of the housing of the chip.

The controller can, for example, determine by means of a plausibility check whether a defect is present and whether all elements are operating properly. This can be determined by the Hall voltage at the individual Hall effect sensor elements if, for example, well defined currents are directed through the individual Hall effect sensor elements. The drop in voltage at the Hall effect sensor elements can likewise be used in the plausibility check.

According to one embodiment of the invention, the controller is designed to apply a defined current to the first Hall effect sensor element and/or the second Hall effect sensor element and to compare an outputted Hall voltage to a defined Hall voltage in order to detect a defect. If the outputted Hall voltage deviates from an expected value that is defined in the controller by more than a tolerance value, the Hall effect sensor element is no longer operating properly.

According to one embodiment of the invention, the controller is designed to determine a drop in voltage across the first Hall effect sensor element and/or the second Hall effect sensor element and to compare said drop in voltage to a defined drop in voltage. The internal resistance of the Hall effect sensor element can, for example, be determined via the drop in voltage. If the internal resistance changes, the Hall effect sensor element can be defective.

According to one embodiment of the invention, the controller is designed, in the event of a detected defect at a first Hall effect sensor element from a pair of Hall effect sensor elements, to disconnect further first Hall effect sensor elements of further pairs of Hall effect sensor elements from the power supply. The controller can disconnect further Hall effect sensor elements that are possibly not defective from the power supply in order, for example, to restore symmetries in the arrangement of the Hall effect sensor elements which are required for the evaluation. Should a malfunction be determined, a sensor operation can then be maintained by means of a suitable switching of said Hall effect sensor elements.

According to one embodiment of the invention, the pairs of Hall effect sensor elements are arranged symmetrically with respect to a common central point. The controller is designed to disconnect a further first Hall effect sensor element, which lies opposite to the first Hall effect sensor element, from the power supply. The controller can, for example, disconnect a first Hall effect sensor element of an opposing pair of Hall effect sensor elements from the power supply, so that the corresponding component of the magnetic field, which the two opposing pairs record, is only then recorded by respectively one Hall effect sensor element.

According to one embodiment of the invention, the controller is designed to disconnect all of the first Hall effect sensor elements from the power supply. The controller can also disconnect all of the first Hall effect sensor elements from the power supply so that only the second Hall effect sensor elements record the magnetic field.

In this way, the corresponding Hall voltage will in fact normally be halved. Said Hall voltage can however still be reliably evaluated by the controller.

According to one embodiment of the invention, the Hall effect sensor elements, the first switch, the second switch as well as further relevant switches for disconnecting the Hall effect sensor elements and/or the controller are disposed on a semiconductor chip. The chip can be integrally cast in a plastic housing which comprises pins for connecting to a printed circuit board.

A further aspect of the invention relates to a method for controlling a Hall effect sensor as said sensor is described above and below.

According to one embodiment of the invention, the method comprises the following steps: determining whether a first Hall effect sensor element is defective; and disconnecting the first Hall effect sensor element from the power supply if said first Hall effect sensor element was determined to be defective.

The method can further comprise the step of disconnecting further first Hall effect sensor elements of further pairs of Hall effect sensor elements from the power supply if the first Hall effect sensor element was determined to be defective.

It should be understood that said method can be carried out by the controller described above. It should also be understood that features or functions of the controller can be features of the method and vice versa.

BRIEF DESCRIPTION OF THE DRAWINGS

Exemplary embodiments of the invention are described below in detail with reference to the attached drawings. In the drawings.

Identical or similar parts are generally provided with the same reference signs.

DETAILED DESCRIPTION

Figure 1:
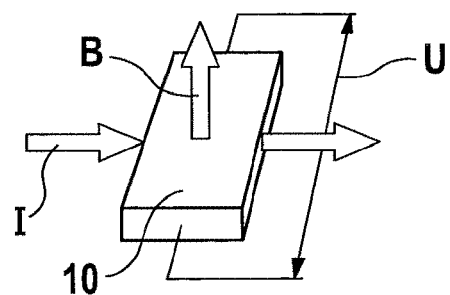
FIG. 1 shows a schematic view of a Hall effect sensor element for a Hall effect sensor according to one embodiment of the invention.

FIG. 1 explains the functionality of a Hall effect sensor element 10. If a current I is passed through the Hall effect sensor element 10 and a magnetic field B, which is orthogonal to the current I, has penetrated said Hall effect sensor element, a Hall voltage U occurs at the ends of the Hall effect sensor element 10, said ends being disposed orthogonally to the current I and the magnetic field B. The Hall voltage is proportional to the vector product of current I and magnetic field B.

Figure 2:
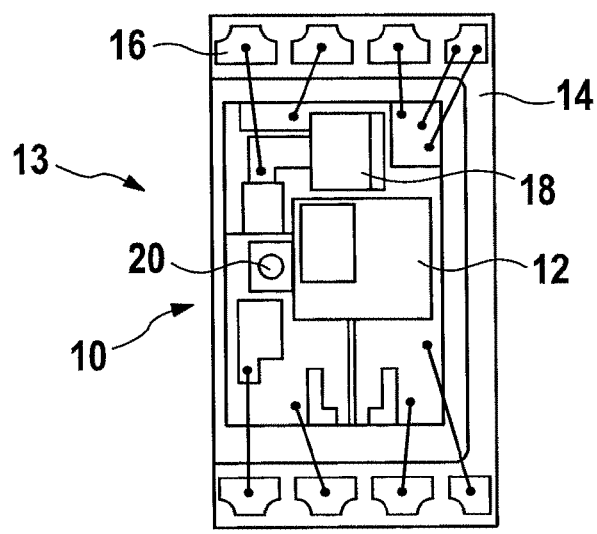
FIG. 2 shows a view of a semiconductor chip as described above comprising a Hall effect sensor according to one embodiment of the invention.
Figure 3:
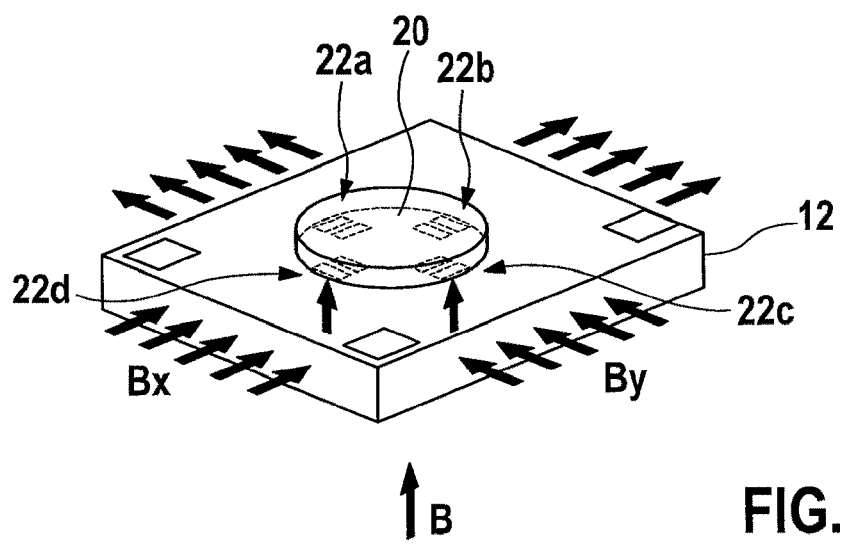
FIG. 3 shows a schematic, three dimensional view of a cutout from FIG. 2.

FIG. 2 shows a semiconductor chip 12 on which a Hall effect sensor 13 comprising a plurality of Hall effect sensor elements 10 is arranged. The chip 12 is surrounded by a plastic housing 14 on which a plurality of pins 16 are fastened, said pins being connected to inputs and outputs of the chip 12. An electronic controller 18 is also arranged on the chip 12, said controller being designed to actuate the Hall effect sensor elements 10 and to evaluate the Hall voltage thereof The Hall effect sensor elements 10 are located below a flux concentrator 20 which is shown in detail in FIG. 3. It can be seen in FIG. 3 that four pairs 22a, 22b, 22c, 22d of Hall effect sensor elements are disposed below the flux concentrator 20 on the chip 12. The components Bx and By of a magnetic field which extends parallel to the surface of the chip 12 are deflected by the flux concentrator 20 in a direction orthogonally to the surface of the chip 12; thus enabling the Hall effect sensor elements to also record the components Bx and By.

A two dimensional Hall effect sensor 13 is shown in the drawings. It is however also possible for the invention to apply to a three dimensional Hall effect sensor.

Figure 4:
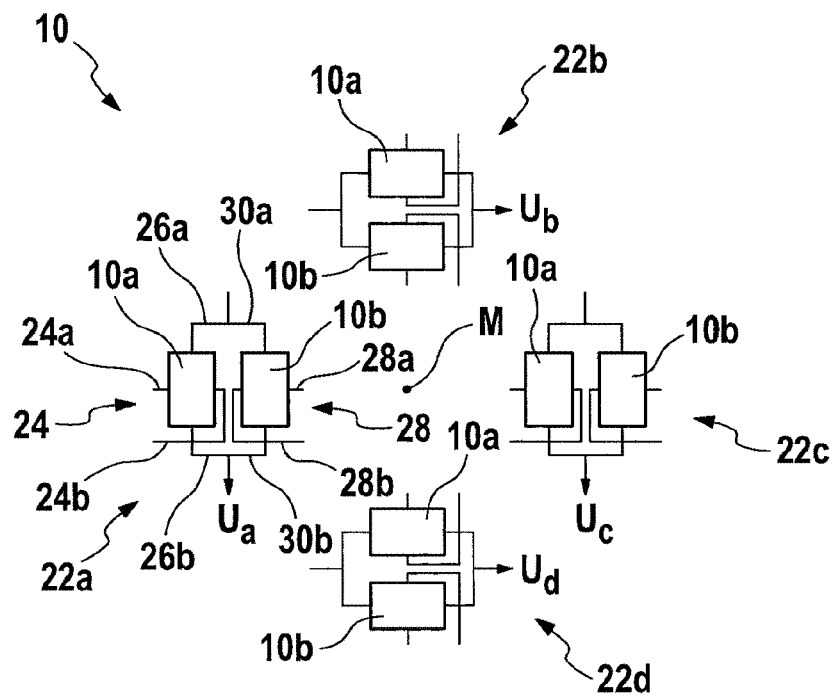
FIG. 4 shows schematically an arrangement of Hall effect sensor elements for a Hall effect sensor according to one embodiment of the invention.

FIG. 4 shows the arrangement of the pairs 22a, 22b, 22c 22d below the flux concentrator 20. The pairs 22a, 22b, 22c, 22d are disposed at the same distance from a central point M and in each case comprise two Hall effect sensor elements that are disposed parallel to one another. The pairs 22a, 22b, 22c, 22d furthermore are oriented towards the central point M, i.e. the sides of the hall effect sensor elements, whereat a Hall voltage is tapped, point tangentially to a circle about the central point M.

Figure 5:
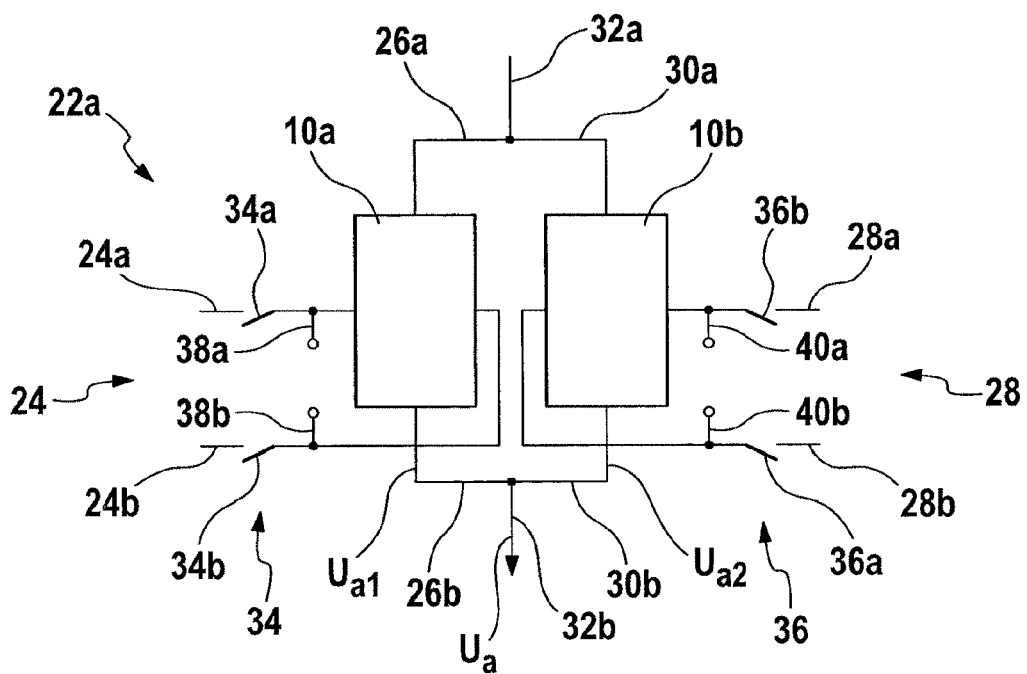
FIG. 5 shows schematically a pair of Hall effect sensor elements for a Hall effect sensor according to one embodiment of the invention.

FIG. 5 shows the pair 22a of Hall effect sensor elements 10a, 10b. It should be understood that the other pairs 22b, 22c, 22d can be constructed exactly as the pair 22a and be connected to the controller in an analogous manner.

The Hall effect sensor element 10a comprises a power supply 24 having two supply lines 24a, 24b for current and two outputs or output lines 26a, 26b to which the Hall voltage Ua1 of the Hall effect sensor element 10a is applied. In an analogous manner, the Hall effect sensor element 10b comprises a power supply 28 having two supply lines 28a, 28b and two output lines 30a, 30b for the Hall voltage Ua2.

The supply lines 24a, 24b, 26a, 26b can be connected to a common power supply, for example directly to two pins 16 of the housing 14, to which a supply current for the chip 12 is applied.

The Hall effect sensor elements 10a, 10b are connected in parallel with respect to the output lines 26a, 26b, 30a, 30b so that the pair 22a has only two output lines 32a, 32b for the Hall voltage Ua which are connected to the controller 18. The sum of the Hall voltages Ua1, Ua2 of the Hall sensor elements 10a, 10b is applied to the output 32a, 32b of the pair 22a. The pairs 22b, 22c, 22d emit corresponding Hall voltages Ub, Uc and Ud.

The power supply 24 of the Hall effect sensor element 10a can be disconnected from said Hall effect sensor element 10a by means of a switch 34. The switch 34 thereby comprises two semiconductor switching elements 34a, 34b which are respectively disposed in the supply line 24a, 24b and therefore are connected upstream and downstream of the Hall effect sensor element 10a. The two semiconductor switching elements 34a, 34b can be opened and closed by the controller 18.

In an analogous manner, the power supply 28 of the Hall effect sensor element 10b can be disconnected from the Hall effect sensor element 10 or connected to the same with a switch 36 that comprises two semiconductor switching elements 36a, 36b.

The supply lines 24a, 24b of the Hall effect sensor element 10 are furthermore connected to two measuring lines 38a, 38b via which the controller can ascertain a voltage at the Hall effect sensor element 10a. The measuring lines 38a, 38b are mounted within the switching elements 34a, 34b. The supply lines 28a, 28b of the Hall effect sensor element 10b are connected to two analogous measuring lines 40a, 40b.

During normal operation, if no defect is present, all switches 34, 36 or, respectively, all switching elements 34a, 34b, 36a, 36b of all of the Hall effect sensor elements 10a, 10b of all of the pairs 22a, 22b, 22c, 22d are closed.

During normal operation, the controller 18 ascertains the direction of a magnetic field B, to which the Hall effect sensor is exposed, from the Hall voltages Ua, Ub, Uc, Ud at the pairs 22a, 22b, 22c, 22d, which in each case represent the sum of the individual Hall voltages of the Hall effect sensor elements 10a, 10b.

The controller 18 now determines at regular intervals whether one of the Hall effect sensor elements 10a, 10b, of all of the pairs 22a, 22b, 22c, 22d is defective.

To meet this end, there is a plurality of options. The controller 18 can, for example, apply a defined current to the lines 24a, 24b (respectively 28a, 28b) of the Hall effect sensor element 10a (respectively 10b) and thereby disconnect the second Hall effect sensor element 10b (respectively 10a) from the power supply thereof and compare an outputted voltage to a defined Hall voltage. It is also possible for the controller 18 to determine a drop in voltage across the Hall effect sensor element 10a (respectively 10b) by means of the measuring lines 38a, 38b (respectively 40a, 40b) and compare the same to a predefined value.

If the controller detects a defect in a Hall effect sensor element 10a, 10b, said controller emits an external signal via one of the pins 16.

In addition, the defective Hall effect sensor element and possibly further Hall effect sensor elements are deactivated and disconnected from the power supply.

If, for example, the Hall effect sensor element 10a of the pair 22a is defective, the controller could additionally deactivate the Hall effect sensor element 10a of the opposing pair 22c. In this case, the direction of the magnetic field is ascertained from the Hall voltages Ub and Ud of the first and the second Hall effect sensor elements 10a, 10b of the pairs 22b and 22d and from the Hall voltages Ua and Uc of the second Hall effect sensor elements 10b of the pairs 22a and 22b.

All of the first sensor elements 10a of the pairs 22a, 22b, 22c, 22d could also be deactivated in the case of the Hall effect sensor element 10a of the pair 22a being defective. In this case, the direction of the magnetic field B is ascertained only by the Hall voltages of the second sensor elements 10b. If only one sensor element 10b is used in all of the pairs 22a, 22b, 22c, 22d, the amplitude of the voltage is cancelled out (Cordic algorithm).

It should be additionally pointed out that "comprising" does not exclude any other elements or steps and "a" does not exclude a plurality. It should furthermore be noted that features or steps which have been described with reference to one of the above exemplary embodiments can also be used in combination with other features or steps of other exemplary embodiments described above. Reference signs in the claims are not to be considered as limiting factors.

What is claimed is:

1. A hall effect sensor (10) for recording the direction of a magnetic field (B), the Hall effect sensor (10) comprising:
   a plurality of Hall effect sensor elements (10a, 10b) arranged in pairs (22a, 22b, 22c, 22d), wherein each pair comprises a first Hall effect sensor element (10a) and a second Hall effect sensor element (10b) which are arranged parallel to one another;
   wherein the Hall effect sensor (10) has a first switch (34) for disconnecting the first Hall effect sensor element (10a) from a power supply (24), and
   wherein, during a normal operation, the direction of a magnetic field (B), to which the Hall effect sensor (10) is exposed, is ascertained from Hall voltages ($U_a$, $U_b$, $U_c$, $U_d$) at the pairs (22a, 22b, 22c, 22d) which in each case represent the sum of the individual Hall voltages of the Hall sensor elements (10a, 10b).

2. The hall effect sensor (10) according to claim 1, wherein the Hall effect sensor (10) has a second switch (36) for disconnecting the second Hall effect sensor element (10b) from a power supply (28).

3. The hall effect sensor (10) according to claim 2, wherein at least one of the first switch (34) and the second switch (36) comprises two semiconductor switching elements (34a, 34b; 36a, 36b) which are connected upstream and downstream of the associated first Hall effect sensor element (10a) or second Hall effect sensor element (10b).

4. The hall effect sensor (10) according to claim 1, wherein each pair (22a, 22b, 22c, 22d) of Hall effect sensor elements (10, 10b) comprises a first switch (34) for a first Hall effect sensor element (10a) and a second switch (36) for a second Hall effect sensor element (10b).

5. The hall effect sensor (10) according to claim 1, wherein the pairs (22a, 22b, 22c, 22d) of Hall effect sensor elements (10a, 10b) are disposed at the same distance from a central point (M) and each pair is oriented towards the central point.

6. The hall effect sensor (10) according to claim 1, further comprising:
- a controller (18) for ascertaining a direction of the magnetic field (8) from an output voltage of the Hall effect sensor elements,
- wherein the controller (18) is configured to actuate the first switch (34).

7. The hall effect sensor (10) according to claim 6, wherein the controller (18) is configured to determine whether at least one of the first Hall effect sensor element (10a) and the second Hall effect sensor element (10b) is defective.

8. The hall effect sensor (10) according to claim 7, wherein the controller (18) is configured to apply a defined current to the at least one of the first Hall effect sensor element (10a) and the second Hall effect sensor element (10b) and to compare an outputted Hall voltage to a defined Hall voltage.

9. The hall effect sensor (10) according to claim 7, wherein the controller (18) is configured to determine a drop in voltage across the at least one of the first Hall effect sensor element (10) and the second Hall effect sensor element (10b) and to compare the drop in voltage to a defined drop in voltage.

10. The hall effect sensor (10) according to claim 7, wherein the controller (18) is configured to emit an external signal if a defect has been detected.

11. The hall effect sensor (10) according to claim 7, wherein the controller is configured, in the event of a detected defect at the first Hall effect sensor element (10a), to disconnect further first Hall effect sensor elements (10a) of further pairs of Hall effect sensor elements from the power supply (24).

12. The hall effect sensor (10) according to claim 11, wherein the pairs (22a, 22b, 22c, 22d) of Hall effect sensor elements are disposed symmetrically with respect to a common central point and the controller is configured to disconnect a further first Hall effect sensor element (10a) which lies opposite the first Hall effect sensor element (10a) from the power supply (24).

13. The hall effect sensor (10) according to claim 11, wherein the controller is configured to disconnect all of the first Hall effect sensor elements (10a) from the power supply (24).

14. The hall effect sensor (10) according to claim 1, wherein the Hall effect sensor elements (10a, 10b), switches (34, 36) for disconnecting the Hall effect sensor elements from the power supply (24, 28) and a controller (18) are disposed on a semiconductor chip (12).

15. A method for controlling a Hall effect sensor (10), which comprises a plurality of Hall effect sensor elements (10a, 10b) arranged in pairs (22a, 22b, 22c, 22d),
- wherein each pair comprises a first Hall effect sensor element (10a) and a second Hall effect sensor element (10b) which are arranged parallel to one another,
- wherein the Hall sensor (10) has a first switch (34) for separating the first Hall sensor element (10a) from a current supply (24),
- wherein, during a normal operation, the direction of a magnetic field (B), to which the Hall sensor is exposed, is ascertained from Hall voltages ($U_R$, $U_b$, $U_c$, $U_d$) at the pairs (22a, 22b, 22c, 22d) which in each case represent the sum of the individual Hall voltages of the Hall sensor elements (10a, 10b),
- wherein the method comprises the following steps:
  - determining whether a first Hall effect sensor element (10a) is defective; and
  - disconnecting the first Hall effect sensor element (10a) from a power supply (24) in the event a defect has been detected at the first Hall effect sensor element (10a).

16. The hall effect sensor (10) according to claim 1, wherein the Hall sensor elements (10a, 10b) of a pair (22a, 22b, 22c, 22d) are connected in parallel with respect to output lines (26a, 26b, 30a, 30b) such that the pair (22a, 22b, 22c, 22d) has only two output lines (32a, 32b) for the Hall voltage $U_a$.

17. The hall effect sensor (10) according to claim 1, wherein the Hall sensor (10) has four pairs (22a, 22b, 22c, 22d) of Hall sensor elements (10a, 10b).

18. The hall effect sensor (10) according to claim 1, wherein the Hall sensor (10) is designed as a semiconductor chip.

* * * * *